(12) United States Patent
Komuro

(10) Patent No.: US 6,204,543 B1
(45) Date of Patent: Mar. 20, 2001

(54) SEMICONDUCTOR DEVICE HAVING LDD STRUCTURE AND METHOD FOR PRODUCING THE SAME

(75) Inventor: Toshio Komuro, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/150,253

(22) Filed: Sep. 10, 1998

(30) Foreign Application Priority Data

Sep. 11, 1997 (JP) .................................................... 9-246631

(51) Int. Cl.$^7$ .................................................... H01L 29/76
(52) U.S. Cl. .................... 257/408; 257/288; 257/330; 257/336; 257/344; 257/346; 257/408; 257/412
(58) Field of Search .................... 257/288, 330, 257/346, 408, 412, 336, 344

(56) References Cited

U.S. PATENT DOCUMENTS

| | | | | |
|---|---|---|---|---|
| 5,565,700 | * | 10/1996 | Chou et al. ............................ | 257/408 |
| 5,710,438 | * | 1/1998 | Oda et al. .............................. | 257/69 |
| 5,719,430 | * | 2/1998 | Goto ..................................... | 257/403 |
| 5,801,426 | * | 9/1998 | Okamura .............................. | 257/386 |
| 5,830,788 | * | 11/1998 | Hiroki et al. ......................... | 438/199 |
| 5,846,871 | * | 12/1998 | Lee et al. ............................. | 438/592 |
| 5,903,029 | * | 5/1999 | Hayashida et al. .................. | 257/344 |
| 5,929,483 | * | 7/1999 | Kim et al. ............................. | 257/336 |
| 5,945,710 | * | 8/1999 | Oda et al. .............................. | 257/344 |

FOREIGN PATENT DOCUMENTS

| | | | |
|---|---|---|---|
| 49-16235 | 4/1974 | (JP) . | |
| 63-293979 | 11/1988 | (JP) . | |
| 9-181307 | 7/1997 | (JP) . | |
| 363193567 | * 8/1998 | (JP) ..................................... | 257/346 |
| 363226963 | * 9/1998 | (JP) ..................................... | 257/346 |
| 405075115 | * 9/1998 | (JP) ..................................... | 257/408 |

* cited by examiner

Primary Examiner—Mahshid Saadat
Assistant Examiner—Edgardo Ortiz
(74) Attorney, Agent, or Firm—Sughrue, Mion, Zinn, Macpeak & Seas, PLLC

(57) ABSTRACT

A gate electrode is formed on a first conductive type semiconductor. Next, a second conductive type first impurity is selectively introduced in a drain formation planned region at a surface of the semiconductor substrate to form a first diffusion layer. Then, a second conductive type second impurity having a diffusion coefficient smaller than that of the first impurity is selectively introduced in a source formation planned region at the surface of the semiconductor substrate to form a second diffusion layer. Thereafter, a side wall is formed on a side surface of the gate electrode. Then, a second conductive type third impurity is introduced at the surface of the semiconductor substrate at a density higher than the first and second impurities, using the gate electrode and the side wall as a mask.

7 Claims, 4 Drawing Sheets

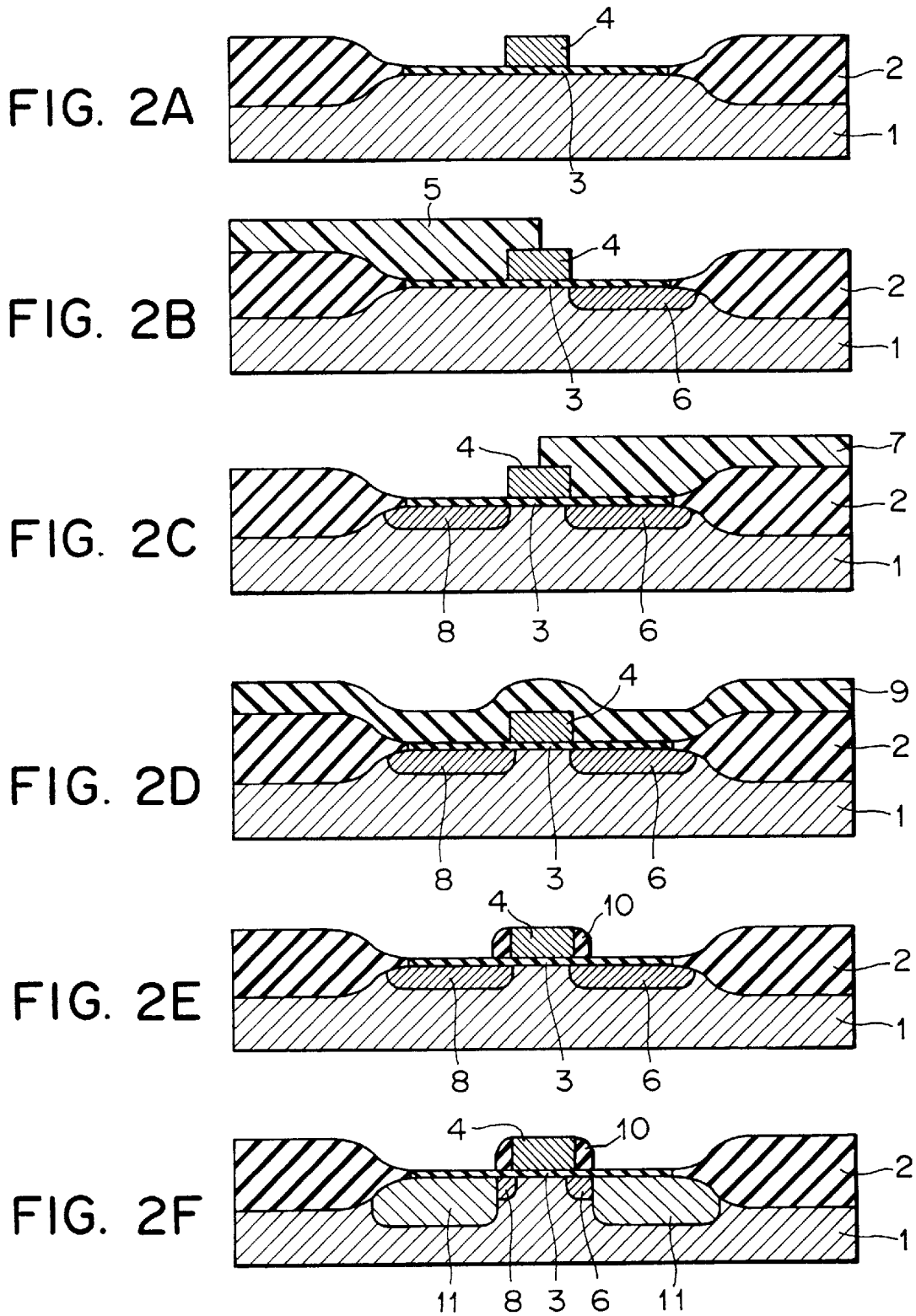

SEMICONDUCTOR DEVICE HAVING LDD STRUCTURE AND METHOD FOR PRODUCING THE SAME

BACKGROUND OF THE INVENTION

1. Field of the Invention

The present invention relates to a semiconductor device which is capable of operating at a high speed and which includes source-drain regions of LDD structure, and a method for producing the same.

2. Description of the Related Art

Recently, higher integration and higher speed of LSI are required, and a MOS transistor which operates at higher speed and which is further miniaturized is required. However, once a MOS transistor is further miniaturized, there arise problems that withstand voltage of source-drain is lowered, a gate threshold voltage and conductance are varied by hot electron, and inconvenience due to short channel such as punch-through phenomenon is generated.

For example, main cause of variations of various characteristics of a miniaturized N-channel MOS transistor is hot electron in high electric field existing in the vicinity of the drain. Therefore, in order to obtain a high reliability of the N-channel MOS transistor, it is necessary to moderate the electric field in the vicinity of the drain.

The high electric field in the vicinity of the drain exists in a depletion layer from a pinch-off point to the drain, and the maximum electric field exists at metallurgical joint surfaces between a P-type silicon substrate and an $N^+$-region of the drain.

A value of the maximum electric field is increased as a variation of impurity distribution is more abrupt. Therefore, if the impurity distribution in the drain is moderated employing LDD (Lightly Doped Drain) structure, the electric field can be moderated.

However, if the LDD structure is employed, an effectual gate length is shortened, so that the punch-through phenomenon, for example, is prone to be generated. Thereupon, in order to suppress the punch-through phenomenon, there is proposed a structure in which a pocket region including impurities having density higher than the substrate is formed. FIG. 1 is a sectional view showing a conventional N-channel MOS transistor having a pocket region.

In the conventional N-channel MOS transistor having a pocket region, field oxide films 42 and a gate insulation film 43 are formed on a P-type silicon substrate 41. A gate electrode 44 consisting of polycrystalline silicon is formed on the gate insulation film 43. A side wall 45 is formed on a side surface of the gate electrode 44.

Further, a low density region 47 in which N-type impurities are introduced at low density is formed at a surface of the silicone substrate 41 beneath the side wall 45. Pocket regions 48 consisting of impurity regions in which P-type impurities are introduced are formed under the low density region 47 and on side to the gate electrode 44 thereof. High density regions 46 into which N-type impurities are introduced at high density are formed at the surface of the silicon substrate 41 under the gate oxide film 43 located between the side wall 45 and the field oxide films 42. The source-drain regions of LDD structure are constituted in this manner.

In the MOS transistor having the pocket regions 48, since depletion layers extended from the source and the drain are suppressed from being spread, the punch-through phenomenon is suppressed.

However, in the conventional MOS transistor having the pocket regions, the pocket region which is the same as that at the side of the drain is provided at the side of the source, so that channel resistance is increased and the electric current which flows through the transistor is lowered.

For this reason, in order to suppress the short channel effect without lowering the electric current capacity, there is proposed an N-channel MOS transistor in which a pocket region is formed on the side of the drain only (Japanese Unexamined Patent Publication (Kokai) No. Hei 9-181307).

However, if the pocket region is formed on the side of the drain only, there is a problem that electric current leaking to the substrate is increased.

SUMMARY OF THE INVENTION

It is an object of the present invention to provide a semiconductor device having LDD structure which is suitable for high speed operation by shortening a gate length without deteriorating characteristics thereof, and to provide a method for producing the semiconductor device.

A semiconductor device having an LDD structure according to the present invention comprises a first conductive type semiconductor substrate and a field effect MOS transistor formed at a surface of the semiconductor substrate. The field effect MOS transistor has a gate electrode formed on the semiconductor substrate, a drain region and a source region. The drain region includes a second conductive type first diffusion layer formed at the surface of the semiconductor substrate, the second conductive type being opposite to said first conductive type, and a second conductive type second diffusion layer formed closer to the gate electrode than the first diffusion layer at the surface of the semiconductor substrate and having impurity density lower than that of the first diffusion layer. The source region includes a second conductive type third diffusion layer formed at the surface of the semiconductor substrate, and a second conductive type fourth diffusion layer formed closer to the gate electrode than the third diffusion layer at the surface of the semiconductor substrate and having impurity density lower than that of the third diffusion layer. A diffusion coefficient of impurity in the fourth diffusion layer is smaller than that in the second diffusion layer.

In the present invention, since the diffusion coefficient of the impurity in the fourth diffusion layer in the source region is smaller than that of the impurity in the second diffusion layer in the drain region, the fourth diffusion region does not spread so much beneath the gate electrode as compared with the second diffusion layer. Also, a density distribution of the impurity from the drain region to a region under the gate electrode is more moderate than that from the source region to the region under the gate electrode. Therefore, a short channel effect when the gate length is shortened can be suppressed without deteriorating the characteristics of the transistor. That is, the semiconductor device can be adapted to a high speed operation without deteriorating the characteristics of the transistor.

A method for producing a semiconductor device having an LDD structure according to the present invention, comprises the steps of: forming a gate electrode on a first conductive type semiconductor substrate having a drain formation planned region where a drain is to be formed and a source formation planned region where a source is to be formed; introducing a second conductive type first impurity selectively in the drain formation planned region at a surface of the semiconductor substrate to form a first diffusion layer, the second conductive type being opposite to the first conductive type; introducing a second conductive type second impurity having a diffusion coefficient smaller than that of the first impurity selectively in the source formation planned region at the surface of the semiconductor substrate to form a second diffusion layer; forming a side wall on a side surface of the gate electrode; and introducing a second conductive type third impurity at the surface of the semiconductor substrate at a density higher than the first and second impurities, using the gate electrode and the side wall as a mask, to form a third diffusion layer.

BRIEF DESCRIPTION OF THE DRAWINGS

FIGS. 2A to 2F are sectional views showing a method for producing a semiconductor device according to a first embodiment of the present invention in the order of producing steps;

DETAILED DESCRIPTION OF THE PREFERRED EMBODIMENTS

Figure 1:
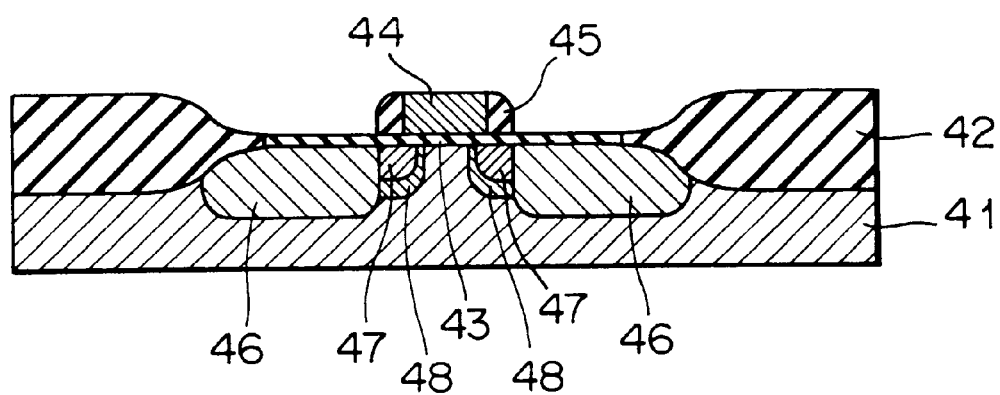
FIG. 1 is a sectional view showing a conventional N-channel MOS transistor having a pocket region.

A semiconductor device and a method for producing the same according to the embodiment of the present invention will be specifically explained below with reference to the accompanying drawings. FIGS. 2A to 2F are sectional views showing a method for producing the semiconductor device according to a first embodiment of the present invention in the order of producing steps.

First, as shown in FIG. 2A, field oxide films 2 are selectively formed by LOCOS process on a P-type semiconductor substrate 1. A gate insulation film 3 having a film thickness of 7.5 nm, for example, is formed between the field oxide films 2 by thermal oxidation process. Next, a gate electrode material having a film thickness of about 100 to 300 nm is formed on the entire surface. Then, a gate electrode 4 having a gate length of 0.31 μm, for example, is selectively formed on the gate oxide film 3 by a known photolithography technique or the like.

Next, as shown in FIG. 2B, a resist pattern 5 covering a region where a source region is to be formed (a source formation planned region) and having an opening in a region where a drain region is to be formed (a drain formation planned region) is formed by a known photolithography technique. Then, using the resist pattern 5 and the gate electrode 4 as a mask, phosphorus (P) is ion-implanted. An acceleration energy at that time is 15 keV, for example, and a dose amount is $2\times10^{13}$ cm$^{-2}$, for example. The acceleration energy may be in a range of 10 to 30 keV, and the dose amount may be in a range of $1\times10^{13}$ cm$^{-2}$ to $5\times10^{13}$ cm$^{-2}$. By this ion-implantation, a low density impurity diffusion layer 6 is formed in the drain formation planned region.

Next, as shown in FIG. 2C, the resist pattern 5 is removed. Then, a resist pattern 7 covering the drain formation planned region and having an opening in the source formation planned region is formed. Then, using the resist pattern 7 and the gate electrode 4 as a mask, arsenic (As) having a diffusion coefficient smaller than that of phosphorus is ion-implanted. An acceleration energy at that time is 30 keV, for example, and a dose amount is $4\times10^{13}$ cm$^{-2}$, for example. The acceleration energy may be in a range of 20 to 50 kev, and the dose amount may be in a range of $3\times10^{13}$ cm$^{-2}$ to $7\times10^{13}$ cm$^{-2}$. By this ion-implantation, a low density impurity diffusion layer 8 is formed in the source formation planned region.

Next, as shown in FIG. 2D, the resist pattern 7 is removed. Then, an insulation film 9 consisting of silicon nitride having a film thickness of 120 nm, for example, is formed on the entire surface.

Thereafter, as shown in FIG. 2E, a side wall 10 is formed on a side surface of the gate electrode 4 by removing the insulation film 9 in a predetermined amount by anisotropic etching.

Next, as shown in FIG. 2F, using the gate electrode 4 and the side wall 10 as a mask, arsenic (As) is ion-implanted. An acceleration energy at that time is 30 keV, for example, and a dose amount is $5\times10^{15}$ cm$^{-2}$, for example. The acceleration energy may be in a range of 20 to 50 keV, and the dose amount may be in a range of $3\times10^{15}$ cm$^{-2}$ to $7\times10^{15}$ cm$^{-2}$. By this ion-implantation, high density impurity diffusion layers 11 are formed in the drain formation planned region and the source formation planned region.

The semiconductor device according to the first embodiment produced in the above-described manner has a structure as shown in FIG. 2F. More specifically, the low density impurity diffusion layer 8, into which arsenic is introduced, and the high density impurity diffusion layer 11, into which arsenic is introduced, are formed in the source region. The low density impurity diffusion layer 6, into which phosphorus is introduced, and the high density impurity diffusion layer 11, into which arsenic is introduced, are formed in the drain region. Since the diffusion coefficient of arsenic is smaller than that of phosphorus as described above, a spreading amount to a region under the gate electrode 4 of the low density impurity diffusion layer 8 formed in the source region is smaller than that of the low density impurity diffusion layer 6 formed in the drain region.

Therefore, according to the first embodiment, since a sufficient distance between the source region and the drain region can be secured, the short channel effect is suppressed. Further, since the low density impurity diffusion layer 6 into which phosphorus having a greater diffusion coefficient is formed in the drain region, the density profile is moderated. For this reason, concentration of electric field is suppressed, and variations of the gate threshold voltage and conductance due to the hot electron are suppressed.

Next, a second embodiment will be explained. FIGS. 3A to 3E are sectional views showing a method for producing a semiconductor device according to the second embodiment of the present invention in the order of producing steps.

Figure 3A:
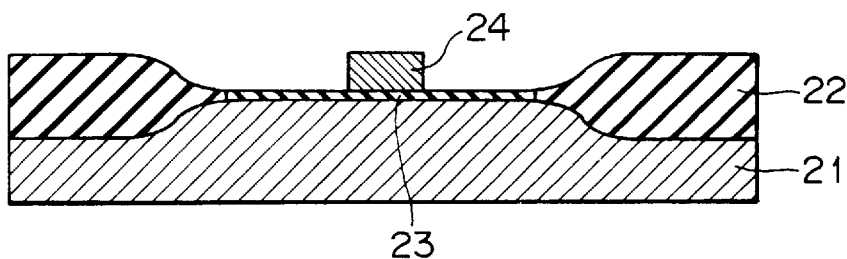
FIGS. 3A to 3E are sectional views showing a method for producing a semiconductor device according to a second embodiment of the present invention in the order of producing steps.

First, as shown in FIG. 3A, field oxide films 22 are selectively formed by LOCOS process on a P-type semiconductor 21. A gate insulation film 23 having a film thickness of 7.5 nm, for example, is formed between the field oxide films 22 by thermal oxidation process. Next, a gate electrode material having a film thickness of about 100 to 300 nm is formed on the entire surface. Then, a gate electrode 24 is selectively formed on the gate oxide film 23 by a known photolithography technique or the like as in the first embodiment.

Figure 3B:
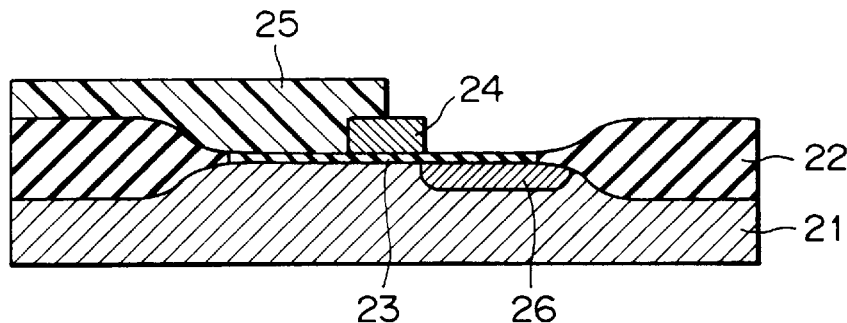

Next, as shown in FIG. 3B, a resist pattern 25 covering a source formation planned region and having an opening in a drain formation planned region is formed. Then, using the resist pattern 25 and the gate electrode 24 as a mask, phosphorus is ion-implanted as in the first embodiment, thereby forming a low density impurity diffusion layer 26 in the drain formation planned region.

Figure 3C:
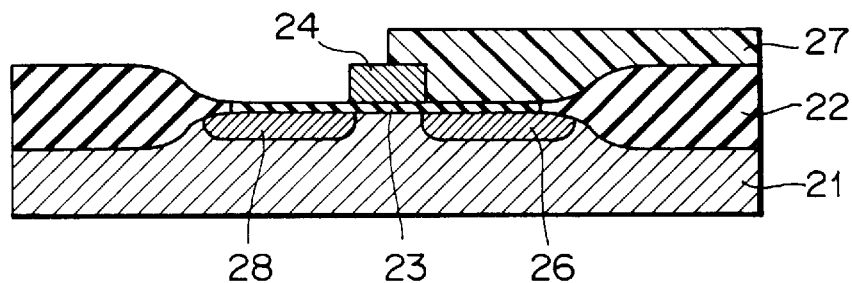

Next, as shown in FIG. 3C, the resist pattern 25 is removed. Then, a resist pattern 27 covering the drain formation planned region and having an opening in the source formation planned region is formed. Then, using the resist pattern 27 and the gate electrode 24 as a mask, arsenic having a diffusion coefficient smaller than that of phosphorus is ion-implanted as in the first embodiment to form a low density impurity diffusion layer 28 in the source formation planned region.

Figure 3D:
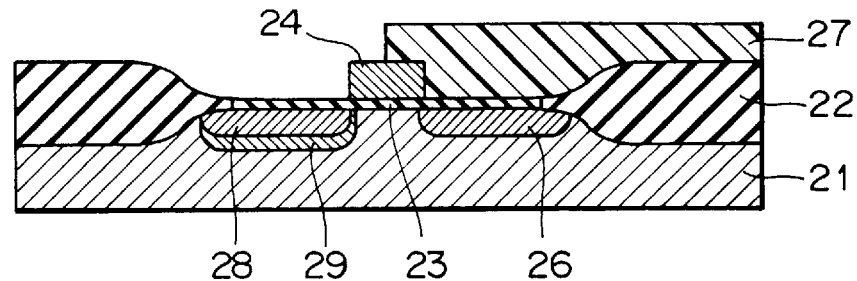

Further, using the resist pattern 27 and the gate electrode 24 as a mask, boron (B) having conductivity type opposite to that of phosphorus and arsenic is ion-implanted. An acceleration energy at that time is 30 keV, for example, and a dose amount is $2 \times 10^{13}$ cm$^{-2}$, for example. The acceleration energy may be in a range of 20 to 40 keV, and the dose amount may be in a range of $1 \times 10^{13}$ cm$^{-2}$ to $3 \times 10^{13}$ cm$^{-2}$. By this ion-implantation, as shown in FIG. 3D, a pocket region 29 having impurity density higher than that of the semiconductor substrate 21 is formed in the source formation planned region.

Figure 3E:
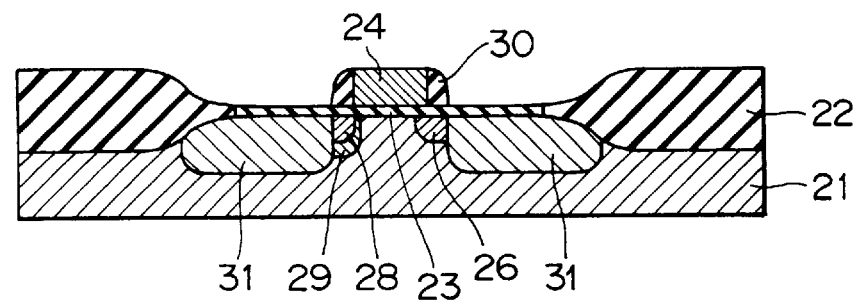

Next, as shown in FIG. 3E, the resist pattern 27 is removed. Then, a side wall 30 is formed on a side surface of the gate electrode 24 as in the first embodiment. Using the gate electrode 24 and the side wall 30 as a mask, arsenic is ion-implanted, thereby forming high density impurity diffusion layers 31 in the drain formation planned region and the source formation planned region.

The semiconductor device according to the second embodiment produced in the above-described manner has a structure as shown in FIG. 3E. More specifically, the low density impurity diffusion layer 28, into which arsenic is introduced, and the high density impurity diffusion layer 31, into which arsenic is introduced, are formed in the source region. The low density impurity diffusion layer 26, into which phosphorus is introduced, and the high density impurity diffusion layer 31, into which arsenic is introduced, are formed in the drain region. Since the diffusion coefficient of arsenic is smaller than that of phosphorus as described above, a spreading amount to a region under the gate electrode 24 of the low density impurity diffusion layer 28 formed in the source region is smaller than that of the low density impurity diffusion layer 26 formed in the drain region as in the first embodiment. Further, in the second embodiment, the pocket region 29 consisting of a P-type impurity diffusion layer is formed around the low density impurity diffusion layer 28 formed in the source region. Therefore, according to the second embodiment, the punch-through phenomenon is suppressed more effectively than the first embodiment.

Next, the effect for suppressing the short channel effect and the leakage current by the first and second embodiments will be explained.

Figure 4:
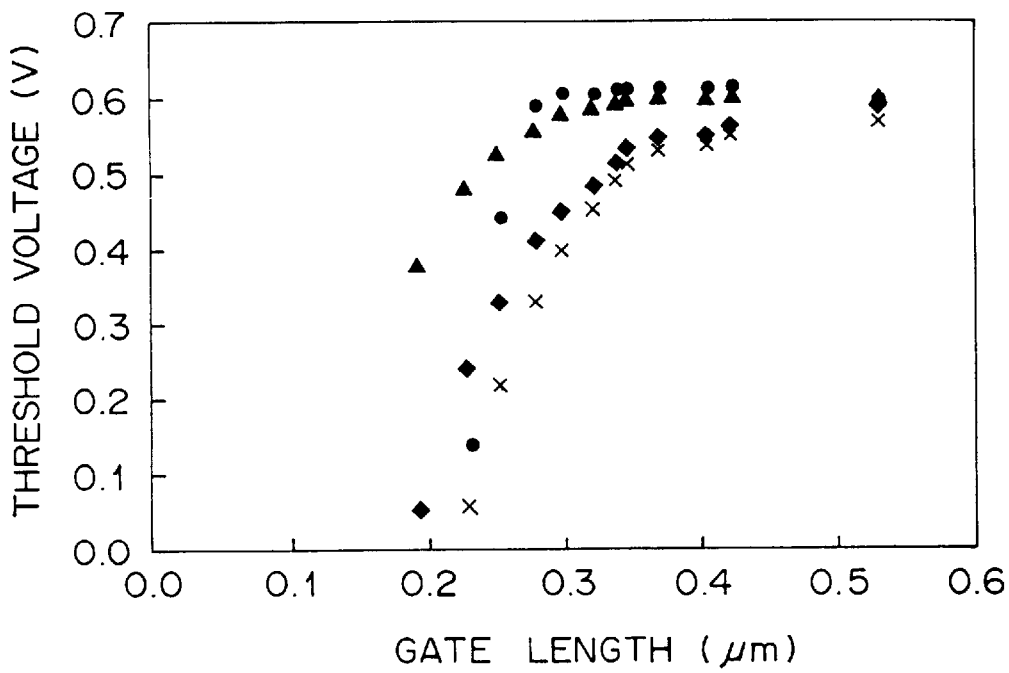
FIG. 4 is a graph showing a relation between a gate length shown along a horizontal axis and a threshold voltage shown along a vertical axis.
Figure 5:
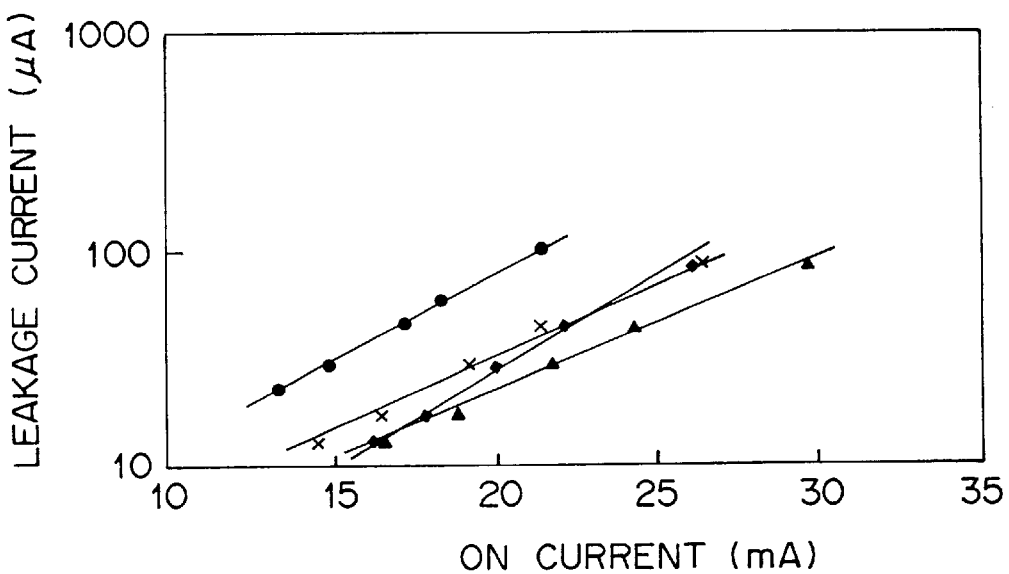
FIG. 5 is a graph showing a relation between ON current shown along a horizontal axis and leakage current of a substrate shown along a vertical axis.

FIG. 4 is a graph showing a relation between a gate length shown along a horizontal axis and a threshold voltage shown along a vertical axis, and FIG. 5 is a graph showing a relation between ON current shown along a horizontal axis and leakage current of a substrate shown along a vertical axis. In FIGS. 4 and 5, a symbol ♦ indicates a characteristic of an N-channel MOS transistor according to the first embodiment, and a symbol ▲ indicates a characteristic of an N-channel MOS transistor according to the second embodiment. A symbol X indicates a characteristic of a conventional N-channel MOS transistor having no pocket region, and a symbol ● indicates a characteristic of a conventional N-channel MOS transistor having a pocket region in which P-type impurity is introduced.

If the symbols ♦ and X indicating characteristics of the MOS transistors having no pocket regions are compared, the threshold voltage in the first embodiment can be measured even in a region where the gate length is shorter as shown in FIG. 4.

Further, if the symbols ▲ and ● indicating characteristics of the MOS transistors having a pocket region are compared, the threshold voltage in the second embodiment can be measured even in a region where the gate length is shorter as shown in FIG. 4.

Furthermore, as shown in FIG. 5, even at high ion current, leakage current of substrate of the symbols ♦ and ▲ indicating characteristics of the MOS transistors of the embodiments of the present invention is lower than that of the symbols X and ● indicating characteristics of the conventional MOS transistors. Especially, the substrate leakage current of the conventional MOS transistor having the pocket region is extremely higher than that of the MOS transistor of the embodiments of the invention.

The impurity introduced to form the low density impurity diffusion layer in the source region should not be limited to arsenic, and the impurity introduced to form the low density impurity diffusion layer in the drain region should not be limited to phosphorus. For example, the low density impurity diffusion layer in the source region may be formed by introducing antimony (Sb), and the low density impurity diffusion layer in the drain region may be formed by introducing phosphorus.

Further, the impurity introduced for forming the pocket region should not be limited to boron. For example, the pocket region may be formed by ion-implanting boron fluoride ($BF_2$).

A transistor to which the present invention is applied should not be limited to an N-channel MOS transistor. The invention may be applied to a P-channel MOS transistor. If the invention is applied to a P-channel MOS transistor, boron fluoride, for example, is ion-implanted for forming the low density impurity diffusion layer in the source region, and boron, for example, is ion-implanted to form the low density impurity diffusion layer in the drain region. With such a selection, the diffusion coefficient of the impurity in the low density impurity diffusion layer in the source region becomes smaller than the diffusion coefficient of the impurity in the low density impurity diffusion layer in the drain region.

Further, also when the invention is applied to a P-channel MOS transistor, a pocket region to which an N-type impurity is introduced may be formed in the source region. In this case, arsenic, phosphorus or the like is ion-implanted.

Furthermore, the order of ion-implantation for forming the source region and the drain region may be reversed. That is, ion-implantation for forming the source region may be carried out first.

What is claimed is:

1. A semiconductor device having an LDD structure, comprising:

a first conductive type semiconductor substrate; and a field effect MOS transistor formed at a surface of said semiconductor substrate; said field effect MOS transistor having:

a gate electrode formed on said semiconductor substrate;

a drain region, said drain region including:
- a second conductive type first diffusion layer formed at the surface of said semiconductor substrate, said second conductive type being opposite to said first conductive type; and
- a second conductive type second diffusion layer formed closer to said gate electrode than said first diffusion layer at the surface of said semiconductor substrate and having impurity density lower than that of said first diffusion layer; and a source region, said source region including:
- a second conductive type third diffusion layer formed at the surface of said semiconductor substrate, and
- a second conductive type fourth diffusion layer formed closer to said gate electrode than said third diffusion layer at the surface of said semiconductor substrate and having impurity density lower than that of said third diffusion layer, a diffusion coefficient of impurity in said fourth diffusion layer being smaller than that in said second diffusion layer.

2. A semiconductor device according to claim 1, wherein said source region comprises a first conductive type fifth diffusion layer formed around said fourth diffusion layer and having impurity density higher than that of said semiconductor substrate.

3. A semiconductor device according to claim 1, wherein
said semiconductor substrate is of P-type,
said impurity in said second diffusion layer is phosphorus, and
said impurity in said fourth diffusion layer is arsenic or antimony.

4. A semiconductor device according to claim 2, wherein
said semiconductor substrate is of P-type, and
said impurity in said fifth diffusion layer is boron.

5. A semiconductor device according to claim 2, wherein said semiconductor substrate is P-type, and said fifth diffusion layer comprises boron fluoride.

6. A semiconductor device according to claim 1, wherein
said semiconductor substrate is N-type,
said second diffusion layer comprises boron and
said fourth diffusion layer comprises boron fluoride.

7. A semiconductor device according to claim 2, wherein
said semiconductor substrate is of N-type, and
said impurity in said fifth diffusion layer is arsenic or phosphorus.

* * * * *